(12) United States Patent
Guo et al.

(10) Patent No.: US 8,736,023 B2
(45) Date of Patent: *May 27, 2014

(54) FIELD EFFECT TRANSISTOR DEVICE AND FABRICATION

(71) Applicant: International Business Machines Corporation, Armonk, NY (US)

(72) Inventors: Dechao Guo, Wappingers Falls, NY (US); Shu-Jen Han, Wappingers Falls, NY (US); Chung-Hsun Lin, White Plains, NY (US); Yanfeng Wang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/775,369

(22) Filed: Feb. 25, 2013

(65) Prior Publication Data

US 2013/0171813 A1    Jul. 4, 2013

Related U.S. Application Data

(63) Continuation of application No. 12/754,917, filed on Apr. 6, 2010, now Pat. No. 8,435,878.

(51) Int. Cl.
| | |
|---|---|
| *H01L 29/772* | (2006.01) |
| *H01L 29/423* | (2006.01) |
| *H01L 29/66* | (2006.01) |
| *H01L 21/8238* | (2006.01) |

(52) U.S. Cl.
CPC .... *H01L 29/42368* (2013.01); *H01L 29/66477* (2013.01); *H01L 21/823842* (2013.01); *H01L 21/823857* (2013.01)

USPC ............. 257/591; 257/592; 257/E21.063; 257/E21.703; 257/E29.772

(58) Field of Classification Search
CPC ............ H01L 29/66477; H01L 29/42368; H01L 29/772; H01L 21/823842; H01L 21/823857
USPC .......... 438/257, 591–596; 257/E21.063, 209, 257/703, 29.129, 157
See application file for complete search history.

(56) References Cited

U.S. PATENT DOCUMENTS

| | | |
|---|---|---|
| 5,719,410 A | 2/1998 | Suehiro et al. |
| 6,444,512 B1 | 9/2002 | Madhukar et al. |

(Continued)

OTHER PUBLICATIONS

Frank, Martin M. et al., "Scaling the MOSFET gate dielectric: From high-k to higher-k? (Invited Paper)" Microelectronic Engineering 86, (2009), (c) 2009 2009 Elsevier B.V., pp. 1603-1608.

(Continued)

*Primary Examiner* — Michael Lebentritt
(74) *Attorney, Agent, or Firm* — Cantor Colburn LLP; Vazken Alexanian

(57) ABSTRACT

A method for forming a field effect transistor (FET) device includes forming a dielectric layer on a substrate, forming a first metal layer on the dielectric layer, removing a portion of the first metal layer to expose a portion of the dielectric layer, forming a second metal layer on the dielectric layer and the first metal layer, and removing a portion of the first metal layer and the second metal layer to define a boundary region between a first FET device and a second FET device.

6 Claims, 4 Drawing Sheets

(56) References Cited

U.S. PATENT DOCUMENTS

| | | | |
|---|---|---|---|
| 6,458,695 | B1 | 10/2002 | Lin et al. |
| 6,518,106 | B2 | 2/2003 | Ngai et al. |
| 6,790,719 | B1 | 9/2004 | Adetutu et al. |
| 6,897,095 | B1 | 5/2005 | Adetutu et al. |
| 7,074,671 | B2 | 7/2006 | Lee et al. |
| 7,105,889 | B2 | 9/2006 | Bojarczuk, Jr. |
| 7,122,414 | B2 | 10/2006 | Huotari |
| 7,351,632 | B2 | 4/2008 | Visokay |
| 7,432,567 | B2 | 10/2008 | Doris et al. |
| 7,528,024 | B2 | 5/2009 | Colombo et al. |
| 7,586,159 | B2 | 9/2009 | Lee |
| 7,655,550 | B2 | 2/2010 | Schaeffer et al. |
| 7,691,701 | B1 | 4/2010 | Belyansky et al. |
| 7,863,126 | B2 | 1/2011 | Park et al. |
| 7,999,323 | B2 | 8/2011 | Cartier et al. |
| 8,120,117 | B2 | 2/2012 | Tsuchiya |
| 8,435,878 | B2 * | 5/2013 | Guo et al. ............ 438/591 |
| 2004/0238859 | A1 | 12/2004 | Polishchuk et al. |
| 2004/0245578 | A1 | 12/2004 | Park et al. |
| 2005/0282329 | A1 | 12/2005 | Li |
| 2007/0090471 | A1 | 4/2007 | Cartier |
| 2008/0217686 | A1 | 9/2008 | Majumdar |
| 2009/0008725 | A1 | 1/2009 | Guha |
| 2009/0108373 | A1 | 4/2009 | Frank et al. |
| 2009/0212369 | A1 | 8/2009 | Park et al. |
| 2009/0283838 | A1 | 11/2009 | Park et al. |
| 2010/0155855 | A1 | 6/2010 | Anderson et al. |
| 2012/0045892 | A1 | 2/2012 | Sengoku |
| 2012/0098067 | A1 | 4/2012 | Yin et al. |

OTHER PUBLICATIONS

Narayanan, V. et al., "Band-Edge High-Performance High-k/Metal Gate n-MOSFETs using Cap Layers Containing Group IIA and IIIB Elements with Gate-First Processing for 45nm and Beyond", 2006 Symposium on VLSI Technology Digest of Technical Papers, (c) 2006 IEEE, downloaded Nov. 25, 2009.

Yu, H.Y., et al. "Transistor threshold voltage modulation by dy2O3 rare-earth oxide capping: The role of bulk dielectrics charge", downloaded Dec. 7, 2009; (c) 2008 American Institute of Physics, Applied Physics Letters 93, 263502-263502-3 (2008).

* cited by examiner

FIELD EFFECT TRANSISTOR DEVICE AND FABRICATION

CROSS-REFERENCE TO RELATED APPLICATION

This application is a continuation of U.S. patent application Ser. No. 12/754,917, filed Apr. 6, 2010, now U.S. Pat. 8,435,878, the disclosure of which is incorporated by reference herein in its entirety.

FIELD OF INVENTION

The present invention relates to field effect transistor devices.

DESCRIPTION OF RELATED ART

Field effect transistor (FET) devices including complimentary metal oxide semiconductors (CMOS) include source regions, drain regions, and gate regions of n-type and p-type devices. In some devices the nFET gates and pFET are connected in fabrication, which affects the voltage characteristics of the devices.

BRIEF SUMMARY

In one aspect of the present invention, a method for forming a field effect transistor (FET) device includes forming a dielectric layer on a substrate, forming a first metal layer on the dielectric layer, removing a portion of the first metal layer to expose a portion of the dielectric layer, forming a second metal layer on the dielectric layer and the first metal layer, and removing a portion of the first metal layer and the second metal layer to define a boundary region between a first FET device and a second FET device.

In another aspect of the present invention, a method for forming a field effect transistor (FET) device includes forming a dielectric layer on a substrate, forming a first metal layer on a portion of the dielectric layer, forming a second metal layer on the dielectric layer and the first metal layer, forming a capping layer on the second metal layer, and removing a portion of the first metal layer and the second metal layer to expose a portion of the dielectric layer, the portion of the dielectric layer defining a boundary region between a first FET device and a second FET device.

In yet another aspect of the present invention, A field effect transistor (FET) device includes a first FET including a dielectric layer disposed on a substrate, a first portion of a first metal layer disposed on the dielectric layer, and a second metal layer disposed on the first metal layer, a second FET including a second portion of the first metal layer disposed on the dielectric layer, and a boundary region separating the first FET from the second FET.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
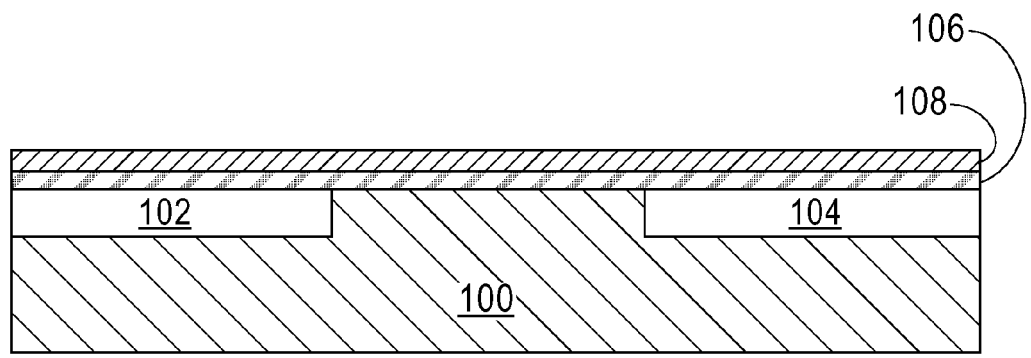
FIGS. 1-5 illustrate an exemplary method for forming a field effect transistor (FET) device.

FIGS. 1-5 illustrate an exemplary method for forming a field effect transistor (FET) device. Referring to FIG. 1, a silicon substrate 100 includes regions 102 and 104. In the illustrated example, the region 102 is doped to form a substrate region for a n-type metal oxide semiconductor (nMOS) device, and the region 104 has been doped to form a substrate region for a p-type device (pMOS). A dielectric layer 106 is formed on the substrate 100. The dielectric layer may include a high-K dielectric material such as, for example, hafnium silicate, hafnium dioxide, zirconium silicate, or zirconium dioxide. A first metal layer 108 is formed on the dielectric layer 106. The first metal layer 108 may include, for example TiN, TiN doped with Aluminum or Aluminum Oxide.

Figure 2:
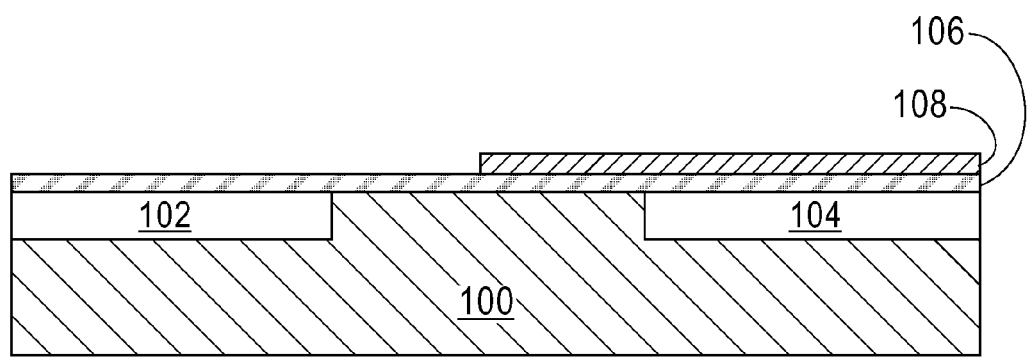

FIG. 2 illustrates the resultant structure following the removal of a portion of the first metal layer 108 to expose a portion of the dielectric layer 106. The portion of the first metal layer 108 may be removed by, for example, a lithographic etching process or another suitable etching process.

Figure 3:
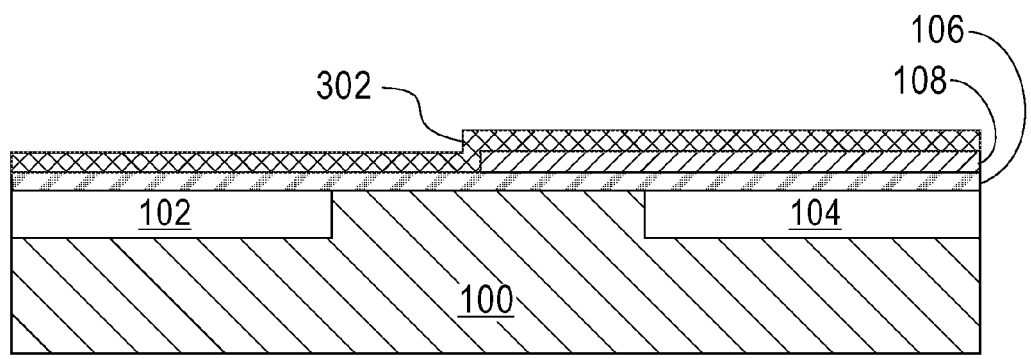

FIG. 3 illustrates the resultant structure following the formation of a second metal layer 302 over the exposed dielectric layer 106 and the first metal layer 108. The second metal layer 302 may include, for example, TiN, TiN doped with Lanthanum, Lanthanum Oxide, Lutetium, or Lutetium Oxide.

Figure 4:
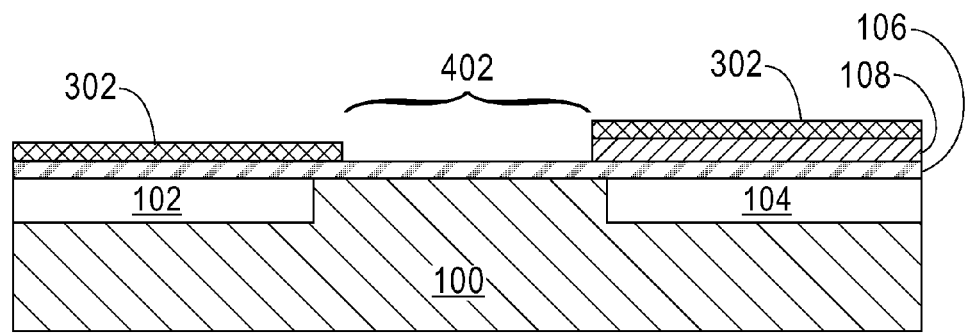

FIG. 4 illustrates the resultant structure following the removal of a portion of the first metal layer 108 and a portion of the second metal layer 302 that exposes a portion of the dielectric layer 106, and defined a boundary region 402.

Figure 5:
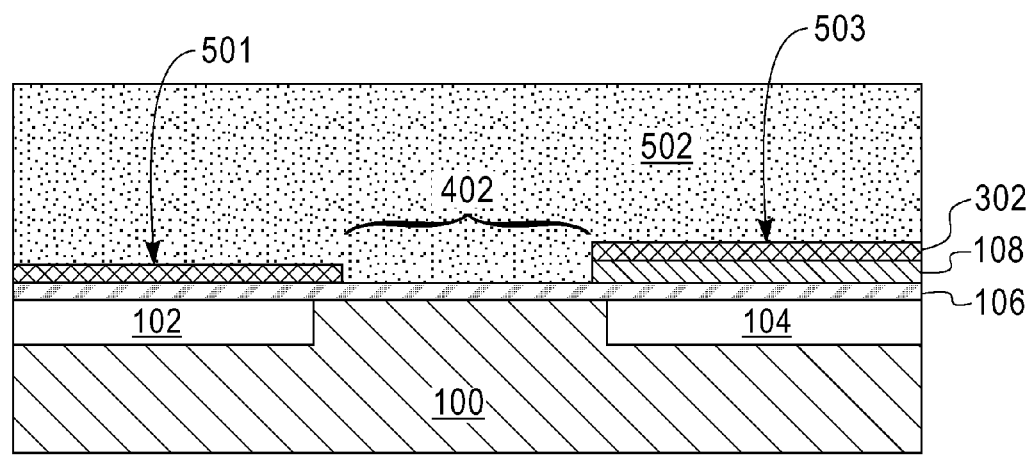

FIG. 5 illustrates the resultant structure following the formation of a capping layer 502 over the second metal layer 302 of the devices and the boundary region 402. The capping layer 502 may include, for example, an amorphous silicon material or metal material, such as W, TiN, or Al.

The formation of the boundary region 402 electrically disconnects the nMOS device 501 from the pMOS device 503. The voltage thresholds (Vt) of the devices may be effected when the devices are connected. The separation allows the voltage threshold (Vt) of each device to be tuned to design specifications.

Figure 6:
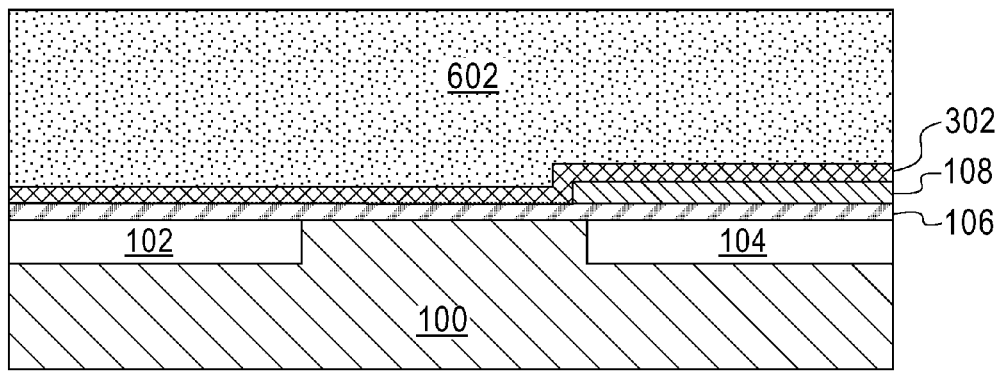
FIGS. 6-8 illustrate an alternate exemplary method for forming a FET device.
Figure 7:
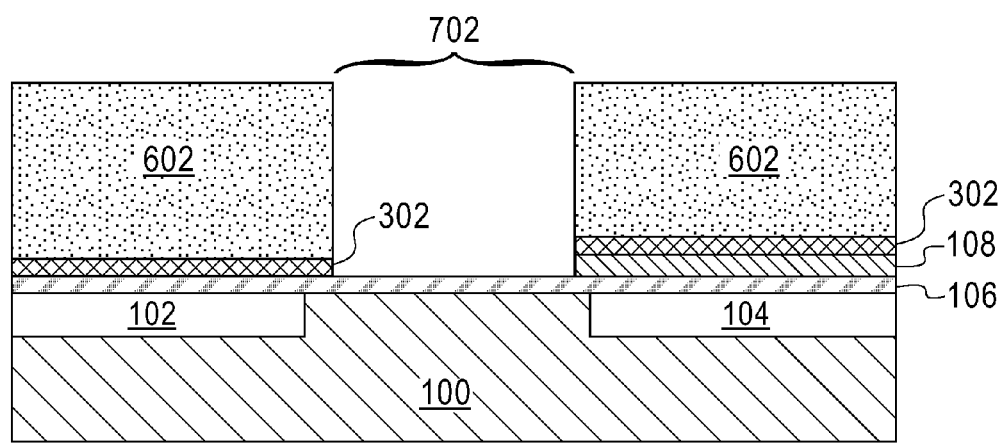
Figure 8:
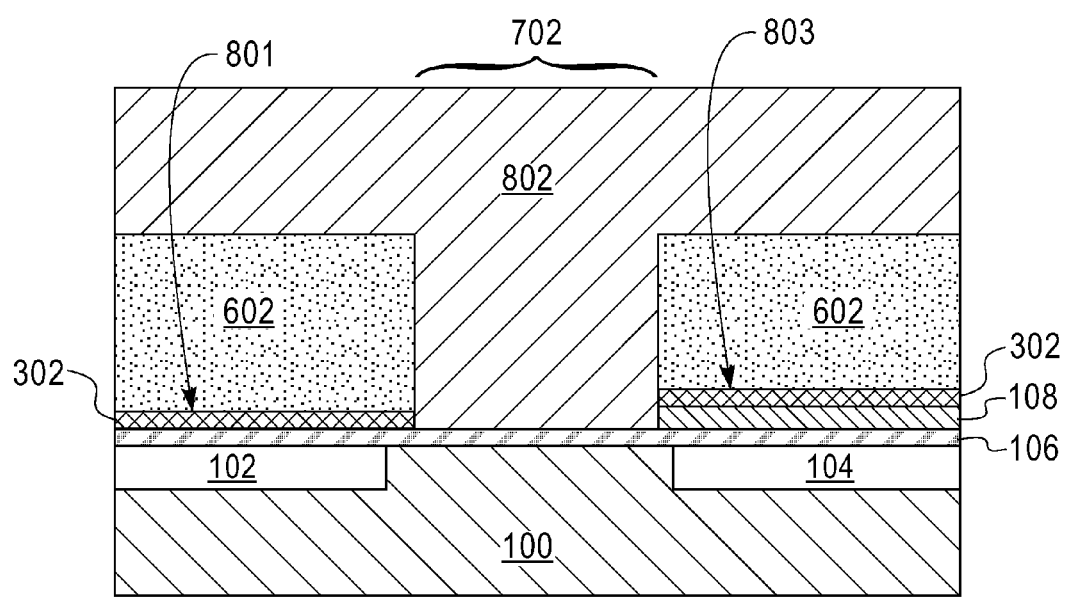

FIGS. 6-8 illustrate an alternate exemplary method for forming similar devices as described above. The alternate exemplary method includes similar methods as described above in FIGS. 1-3, where the dielectric layer 106 is formed on the substrate 100; a first metal layer 108 is formed and patterned on the first dielectric layer 106; and a second metal layer 302 is formed on the first dielectric layer 106 and the first metal layer 108. Referring to FIG. 6, a capping layer 602 is formed on the second metal layer 302. The capping layer 602 is similar to the capping layer 502 (of FIG. 5) described above.

FIG. 7 illustrates the resultant structure following the patterning and removal of portions of the capping layer 602, the second metal layer 302, and the first metal layer 108, which exposes a portion of the dielectric layer 106, and defines a boundary region 702.

FIG. 8 illustrates the resultant structure following the formation of a conductive layer 802 on the boundary region 702 and the capping layer 602. The conductive layer 802 includes, for example, a metallic or polysilicon material, and is operative to electrically connect the gate regions of the nFET 801 and pFET devices 803.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a field effect transistor (FET) device, the method comprising:
    forming a dielectric layer on a substrate;
    forming a first metal layer on a portion of the dielectric layer;
    forming a second metal layer on the dielectric layer and the first metal layer;
    forming a capping layer on the second metal layer; and
    removing a portion of the first metal layer and the second metal layer to expose a portion of the dielectric layer, the portion of the dielectric layer defining a boundary region between a first FET device and a second FET device, such that the capping layer is disposed over the first FET device and the second FET device; and
    forming a conductive layer on the capping layer of the first FET device and the second FET device, and forming the conductive layer on the boundary region.

2. The method of claim 1, wherein the first FET device includes a portion of the dielectric layer, the first metal layer, and a portion of the second metal layer.

3. The method of claim 1, wherein the second FET device includes a portion of the dielectric layer and a portion of the second metal layer.

4. The method of claim 1, wherein the dielectric layer is a high-K layer.

5. The method of claim 1, wherein the second metal layer includes TiN.

6. The method of claim 1, wherein the capping layer includes an amorphous silicon material.

* * * * *